(12) United States Patent
Dousti et al.

(10) Patent No.: US 11,453,590 B2
(45) Date of Patent: Sep. 27, 2022

(54) METHODS TO PATTERN CARBON NANOTUBE SHEETS

(71) Applicant: Board of Regents, The University of Texas System, Austin, TX (US)

(72) Inventors: Behnoush Dousti, Richardson, TX (US); Gil Sik Lee, Richardson, TX (US); Negar Geramifard, Richardson, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 10 days.

(21) Appl. No.: 16/658,493

(22) Filed: Oct. 21, 2019

(65) Prior Publication Data

US 2020/0123009 A1 Apr. 23, 2020

Related U.S. Application Data

(60) Provisional application No. 62/748,506, filed on Oct. 21, 2018.

(51) Int. Cl.
*C01B 32/168* (2017.01)
*C01B 32/162* (2017.01)
*B82Y 30/00* (2011.01)
*B82Y 40/00* (2011.01)

(52) U.S. Cl.
CPC .......... *C01B 32/168* (2017.08); *C01B 32/162* (2017.08); *B82Y 30/00* (2013.01); *B82Y 40/00* (2013.01)

(58) Field of Classification Search
CPC . C01B 32/168; C01B 32/162; C01B 2202/08; B82Y 30/00; B82Y 40/00; C23C 16/01; C23C 16/0281; C23C 16/26; B01J 23/745
See application file for complete search history.

(56) References Cited

U.S. PATENT DOCUMENTS

2008/0170982 A1\* 7/2008 Zhang .................. D01F 9/1273
423/447.3

OTHER PUBLICATIONS

Benham, et al., Nanolithographic patterning of transparent, conductive single-walled nanotube films by inductively coupled plasma reactive ion etching, J. Vac. Sci. Technol. B 2007; 25(2): 348-354 (Year: 2007).\*
Tixier, et al., A silicon shadow mask for deposition on isolated areas, J. Micromech. Microeng. 2000; 10: 157-162 (Year: 2000).\*
Huynh, et al., Understanding the synthesis of directly spinnable carbon nanotube forests, Carbon 2010; 48: 1105-1115 (Year: 2010).\*
Han, et al., Patterning of Single-Walled Carbon Nanotube Films on Flexible Transparent Plastic Substrates, Langmuir 2010; 26(1): 598-602 (Year: 2010).\*

\* cited by examiner

*Primary Examiner* — Daniel C. McCracken
(74) *Attorney, Agent, or Firm* — Schott, P.C.

(57) ABSTRACT

Effective techniques for patterning carbon nanotube (CNT) sheets are disclosed herein. A carbon nanotube forest is grown on a catalyst-incorporated substrate, CNT sheets are drawn from the carbon nanotube forest, the CNT sheets are stacked on a substrate, followed by etching the CNT sheets by using a shadow mask through a controlled etch process. In some implementations, etching of the CNT sheets is carried out in a capacitively coupled plasma (CCP) etching system, where the CNT sheets are selectively exposed, in a controlled environment, to oxygen plasma via the shadow mask.

20 Claims, 11 Drawing Sheets

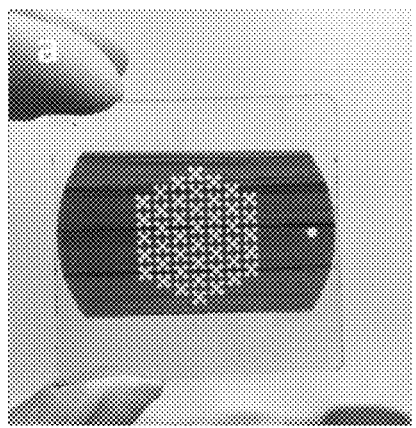
402 ↗ FIG. 4A
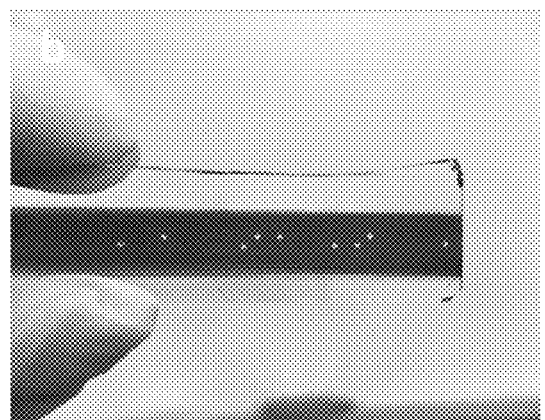
404 ↗ FIG. 4B
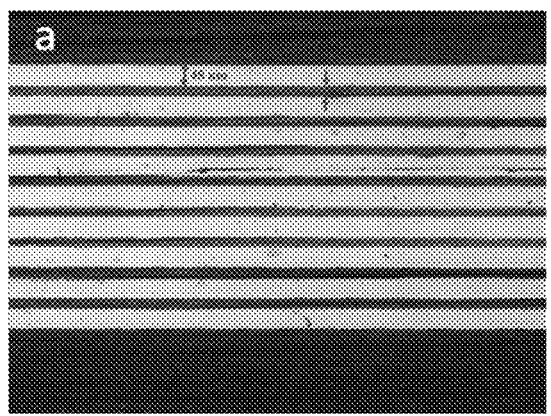
FIG. 5A  502 ↗
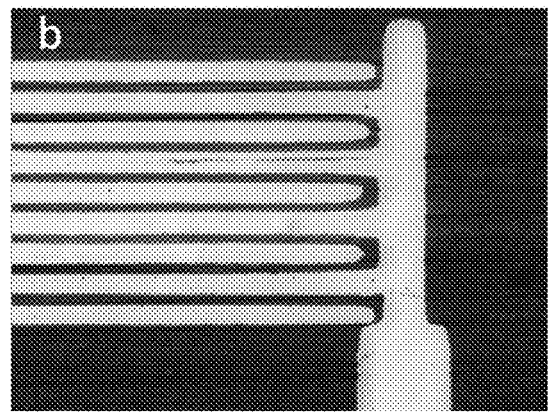
FIG. 5B  ↖ 504
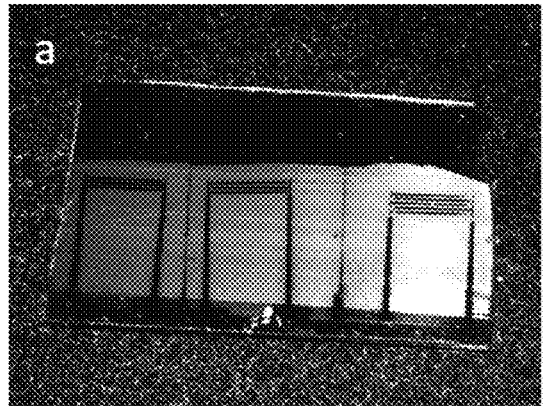
FIG. 6A  602 ↗
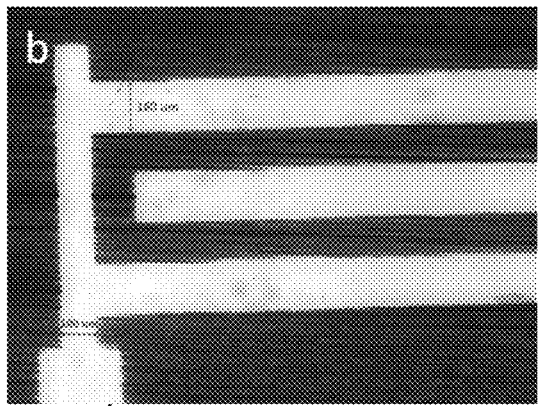
604 ↗  FIG. 6B

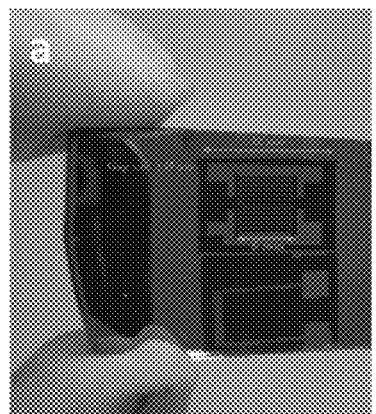
FIG. 7A  702
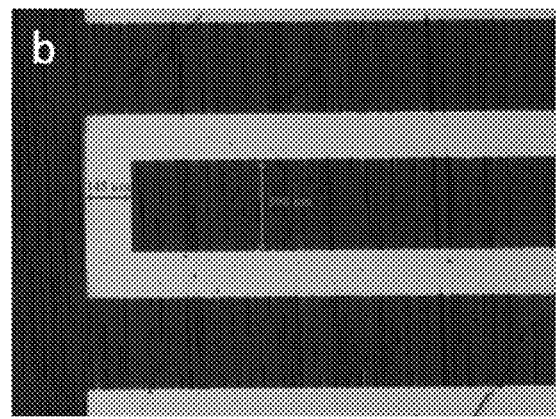
FIG. 7B  704
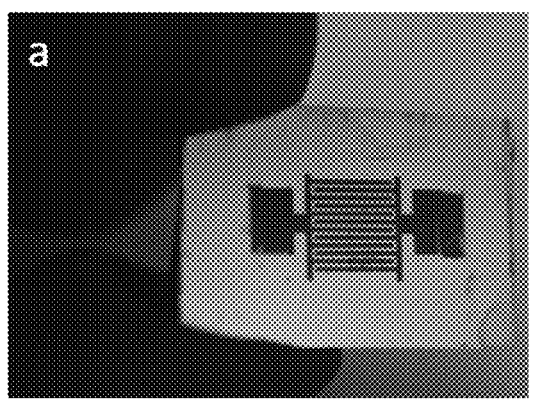
FIG. 8A  802
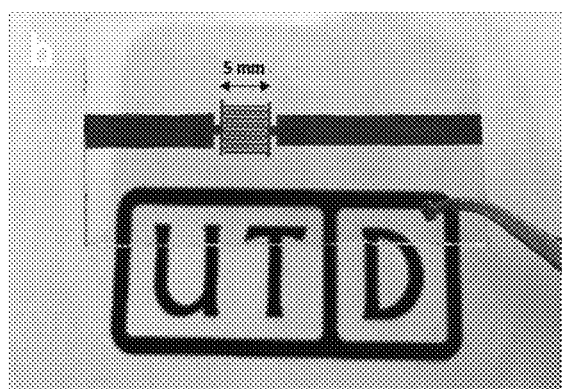
804  FIG. 8B
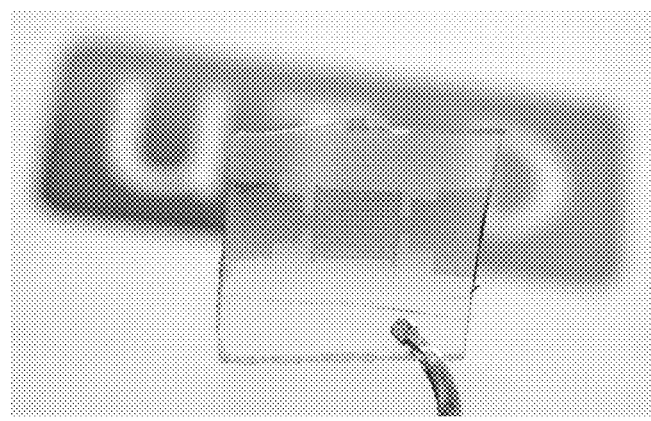
FIG. 9

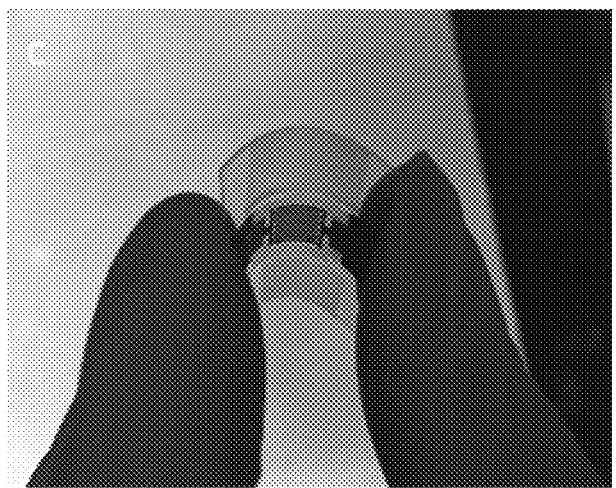
FIG. 11C 1106
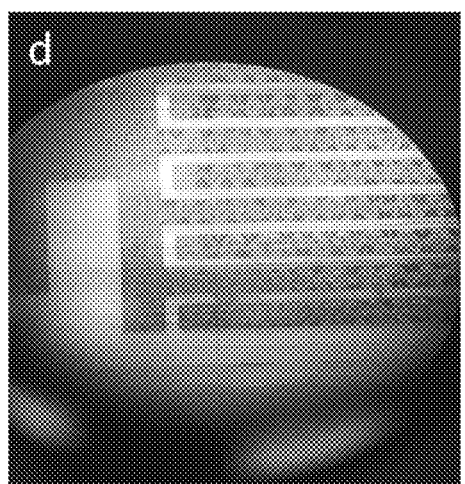
1108 FIG. 11D
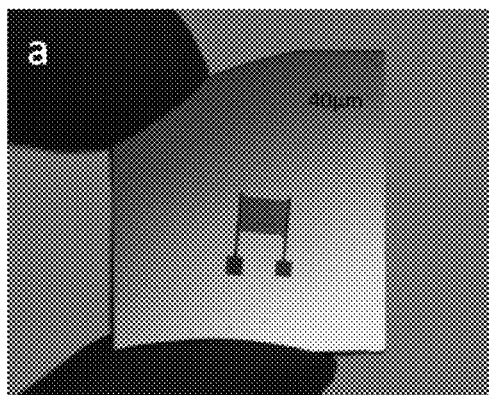
1202
FIG. 12A
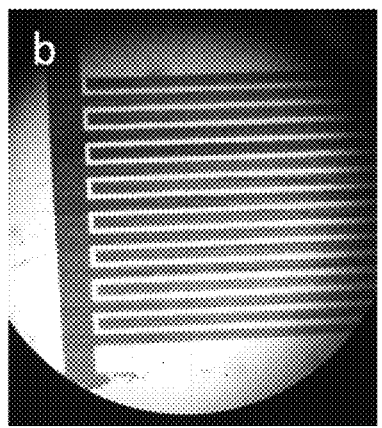
1204 FIG. 12B
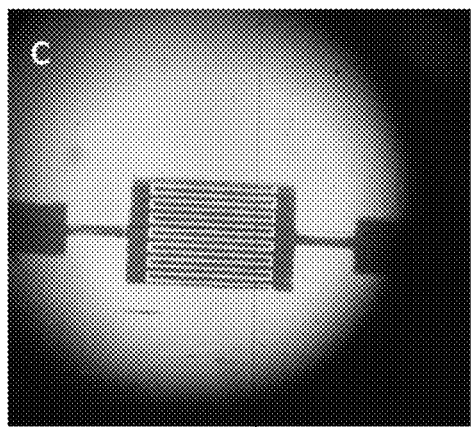
1206 FIG. 12C
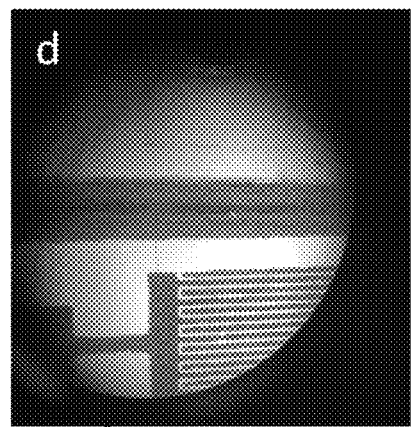
1208 FIG. 12D

METHODS TO PATTERN CARBON NANOTUBE SHEETS

BACKGROUND

Carbon nanotubes (CNTs) have drawn attention in the research communities for design of functional thin films; such as catalytic membranes, actuation and mechanical thin film application. The inherent properties of CNTs include chemical inertness, high conductivity, excellent mechanical properties, metallic and semiconductor behavior, high crystalline orientation, and low ratio of weight to volume. Due to these properties, the CNTs find use in high-end applications such as military aircraft, space, car industry, solid-state devices, and optoelectronics where such properties are required.

For its versatile applications, the CNTs are regarded as a notable alternative for Indium Tin Oxide (ITO) replacement in transparent electrodes owing to their robust mechanical flexibility, excellent electronic properties, and elemental abundance. For example, CNT-based anodes exhibit superior field emission properties along with great mechanical performance with comparable energy conversion efficiency versus devices using ITO. The low sheet resistance of CNTs meet the criteria of transparent conductive films (TCFs) and may replace the conventional ITO for flat panel displays.

High strength of CNTs stems from their stable structure comprising a network of sp2 bonded carbon atoms. This network of carbon-carbon double bonds lends stability to nanotubes and acts as a constraint toward the realization of many potential applications where the nanotubes need to associate themselves with other chemicals and material. For instance, the CNTs may be incorporated into car windshields as heating elements or antenna owing to their strength, thermal conduction, and transparent structure.

Carbon nanotubes thrilling properties such as excellent conductivity, nanoscale pore sizes, and large specific surface areas compared to other carbonaceous materials are of interest for energy storage and conversion applications. Micro supercapacitors based on CNTs are considered by some as the future state-of-the-art, and prospect thin film microscale energy storage devices. They may be used as sole units to deliver high power density required for portable electronic products or be coupled with micro-batteries to provide higher energy density over time.

In search of new materials to provide higher discharge capacity and energy density, and prolonged life cycle for lithium batteries, functionalized carbon nanotubes have emerged a distinguished class of materials to fabricate their electrodes. The multi-walled carbon nanotube (MWCNT) structure provides an excessively shortened pathway of diffusion for Li ions and prohibits the agglomeration of the active materials.

Liquid crystal polymer networks may be used commercially in a variety of applications such as stereoscopic displays, light filters, and laser modulators for their permanent, programmable birefringence owing to their unique optical properties. Patterned CNT sheet may be used as an aligned and anisotropic filler in liquid crustal elastomer composites for multifunctional actuators.

A unique nanostructure known as carbon nanotube sheet may be drawn directly from vertically aligned carbon nanotube (VACNT) forest. This structure offers uniaxial alignment required for improving the conductivity, great mechanical strength (Young's modulus of 310 MPa), and anisotropic electrical and thermal conductivity ($2.5\pm0.5$ W m−1 K−1). Further, the CNT sheets show uniaxial stretching to some extent suitable for flexible electronic applications.

Several methods have been developed to pattern carbon nanotubes films including inkjet printing, electrophoretic deposition, chemical vapor deposition growth patterning, chemical anchored deposition, laser-separation, laser irradiation, and oxygen plasma etching, and molecular imprinting.

Wet methods for preparation of carbon nanotubes film usually involve nanotube solution preparation using a proper surfactant to disperse the CNTs and subsequent infiltration process to remove the solvent. As a result, mechanical integrity and orientation of the carbon nanotubes may be decayed. Hence, the application of CNTs in field emitter array, transparent electrodes, and multi-application sensors where directional conductivity is essential may be hindered.

Other problem related to these preparation methods comes from the fact that existence of a binder material required to increase the adhesion of the CNTs onto the electrode adversely affects the electronic properties of the structure. One method uses a standard photolithography method followed by an electrochemical etching process in an aqueous solution to etch single-walled carbon nanotubes (SWCNTs) films on flexible, transparent polymer substrate. A combination of conventional lithography method and O2 plasma dry etch is also employed to pattern graphene for transparent flexible electrodes, and single walled carbon nanotube films on flexible substrates.

However, these techniques have been mostly applied to a film of carbon nanotube (sprayed networks of multi-walled carbon nanotube (MWCNT) or single-walled carbon nanotube (SWCNT) than CNT sheet structure, and might require several pre-treatment steps in some cases. Also, using lithography techniques, delivering spatially complex structure is achievable, however, photoresist contamination may be inevitable.

There is still some challenge to develop a simple, reproducible, and controllable fabrication technique to produce patterned CNT films on large scale with homogeneous properties and desired shapes.

Further, for effective establishment of CNTs for various applications and for integrating them on a chip it is pivotal to pattern CNT layers (e.g., multisheets). Therefore, it is critical to develop an effective method to pattern CNT layers at high resolution with control over the orientation in order to fabricate the structure of interest with micro scale features.

SUMMARY OF THE EMBODIMENTS

Generally, the present disclosure relates to patterning of carbon nanotubes (CNTs). In particular, the present disclosure describes methods to etch carbon nanotube sheets with desired patterns via a shadow mask.

The present disclosure describes techniques to etch carbon nanotube sheets with desired patterns via a shadow mask. In some implementations, the techniques disclosed herein includes stacking carbon nanotube (CNT) sheets (e.g., parallel or perpendicular) on a substrate and selectively exposing some regions of the CNT sheets to plasma (e.g., oxygen plasma) in a capacitively coupled plasma (CCP) system. Some regions of the CNT sheets are protected from etching via a shadow mask.

In some implementations, a method to pattern carbon nanotubes is disclosed herein. The method comprises growing a spin-capable carbon nanotube forest on a catalyst-incorporated substrate, drawing one or more carbon nanotube sheets from the carbon nanotube forest, stacking the one or more carbon nanotube sheets on another substrate, and etching the one or more carbon nanotube sheets by selectively exposing the one or more carbon nanotube sheets to plasma via a shadow mask.

In some implementations, growing the carbon nanotube forest includes growing the carbon nanotube forest in a horizontal furnace using acetylene as a carbon nanotube-forming precursor. In some implementations, growing the carbon nanotube forest in the horizontal furnace includes providing a gas mixture comprising one or more carbon nanotube-forming precursors and one or more carrier gases, and wherein the one or more carrier gases are selected from the group consisting of Helium, Nitrogen, and Argon. In some implementations, the temperature inside the horizontal furnace is controlled to be between 650° C. to 850° C. for growth of the carbon nanotube forest.

In some implementations, the method to pattern carbon nanotubes includes depositing a catalyst film on a substrate to form the catalyst-incorporated substrate, wherein the catalyst film comprises a transition metal, and wherein the thickness of the catalyst film is less than 20 nanometers. The transition metal may include iron.

In some implementations, stacking the one or more carbon nanotube sheets on the another substrate includes stacking the one or more carbon nanotube sheets without using any of a binder and a photoresist. The another substrate may include one or more of: a flexible polymer (PET, OHP film), a silicon wafer, glass slide, polyimide (PI), Polydimethylsiloxane (PDMS), and a plexiglass acrylic (PA) sheet.

In some implementations, the shadow mask is a silicon shadow mask, and/or a metallic shadow mask. In some implementations, the shadow mask may include a nickel-copper alloy. In some implementations, the method to pattern carbon nanotubes further comprises designing and fabricating the shadow mask based on one or more structures to be patterned on the carbon nanotube sheets. In some implementations, the shadow mask is designed using a deep reactive-ion etching (DRIE) process. In some implementations, the shadow mask is fabricated from a silicon wafer using deep silicon etching.

In some implementations, exposing the one or more carbon nanotube sheets to the plasma via the shadow mask includes exposing the one or more carbon nanotube sheets to oxygen plasma in a capacitively coupled plasma (CCP) system, wherein one or more of: gas pressure, gas flow, plasma power, processing time, and temperature of the CCP system are controlled to optimize etching of the one or more carbon nanotube sheets.

Some implementations provide a method to pattern carbon nanotubes, the method comprising stacking one or more carbon nanotube sheets on a substrate, designing a shadow mask based on one or more structures to be patterned on the one or more carbon nanotube sheets, and employing the shadow mask in a capacitively coupled plasma (CCP) system to etch the one or more carbon nanotube sheets, wherein employing includes selectively exposing the one or more carbon nanotube sheets to oxygen plasma via the shadow mask, thereby etching the one or more structures on the one or more carbon nanotube sheets.

The methods disclosed herein enable patterning highly aligned conductive CNT sheet structures on micro scale (e.g., using oxygen plasma) without using any binder or photoresist.

The etching methods disclosed herein have tremendous implications toward building some of the novel architectures with carbon nanotube sheets which may be modified to integrate them with other materials such as metal oxides or polymers on a chip.

The foregoing has outlined rather broadly the features and technical advantages of the disclosure in order that the detailed description of the disclosure that follows may be better understood. Additional features and advantages of the disclosure will be described hereinafter that form the subject of the claims of the disclosure. It should be appreciated by those skilled in the art that the conception and the specific embodiments disclosed may be readily utilized as a basis for modifying or designing other structures for carrying out the same purposes of the disclosure. It should also be realized by those skilled in the art that such equivalent constructions do not depart from the spirit and scope of the disclosure as set forth in the appended claims.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed disclosure, and explain various principles and advantages of those embodiments.

FIGS. 4A and 4B depict optical images of multi-sheets of 10-layer using a metallic shadow mask, FIGS. 5A and 5B depict optical images of patterned CNT multi-sheets of 10-layer, with interspacing of 15 μm, patterned using a designed Si shadow mask;

FIGS. 6A and 6B depict optical images of an IDE pattern on multi-sheets of 10 CNT layers with different resolution (100-160 μm) patterned using a designed Si shadow mask on a Si substrate;

FIG. 7A depicts an optical image of an IDE pattern on multi-sheets of 10 CNT layers with a gap size of 145 μm and electrode width of 300 μm, for electrodes, patterned using a designed Si shadow mask on gold coated silicon substrate;

FIG. 7B depicts a magnified view of an optical image of FIG. 7A;

FIG. 8A depicts another perspective (view) of an optical image of an IDE pattern on multi-sheets of 10 layers with gap size of 145 μm and width of 300 μm, for electrodes, patterned using a designed Si shadow mask on a gold coated silicon substrate;

FIG. 8B depicts a CNT structure of FIG. 8A with respect to glass slide;

FIG. 9 depicts an image of an IDE micro patterning on one layer of CNT with 300 μm and 145 μm electrode width and interspacing respectively on an acrylic sheet;

FIGS. 11A-11D depict IDE patterns on 10 layers of CNT sheet on flexible substrates: a) OHP film, b) PDMS, c and d) OHP film substrate;

FIGS. 12A and 12B depict optical images of an IDE pattern of multi-sheets of 10 CNT layers on gold coated silicon wafer, with resolution of 40 µm, patterned using a designed Si shadow mask;

FIGS. 12C and 12 D depict optical images of an IDE pattern of multi-sheets of 10 CNT layers on gold coated silicon wafer, with resolution of 15 µm, patterned using a designed Si shadow mask;

DETAILED DESCRIPTION OF THE EMBODIMENTS

Figure 1A:
FIGS. 1A-1F illustrate a patterning (etching) process for carbon nanotubes (CNTs) in accordance with some implementations of the present disclosure.
Figure 1B:
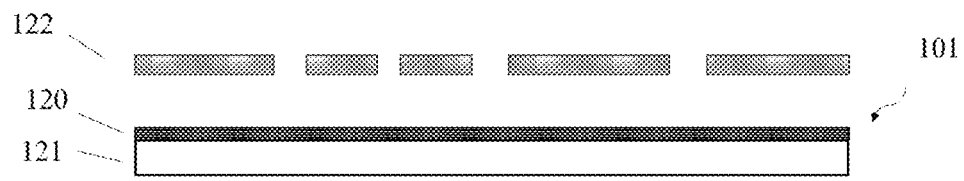
Figure 1C:
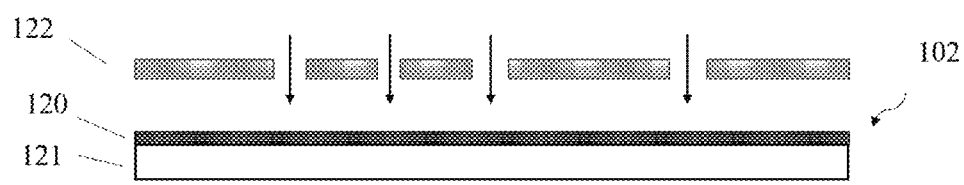
Figure 1D:
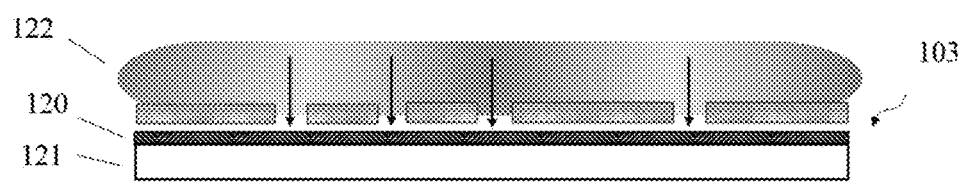
Figure 1E:
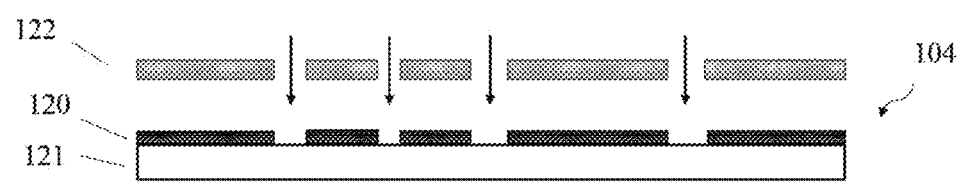
Figure 1F:
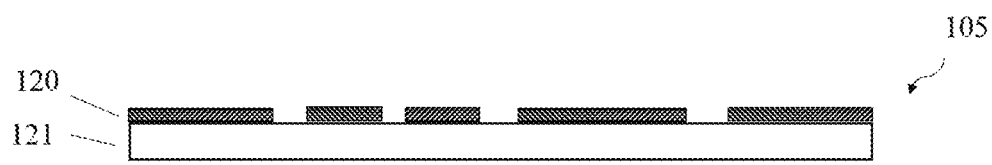
Figure 1G:
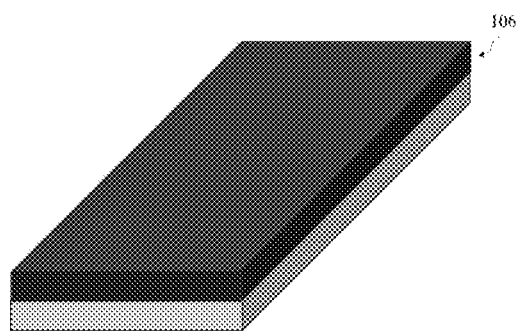
FIGS. 1G-1J illustrate schematic examples of patterned carbon nanotube sheets that have been patterned with the etching process illustrated in FIGS. 1A-1F.
Figure 1H:
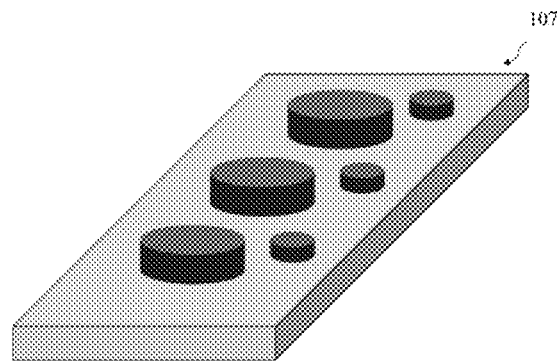
Figure 1I:
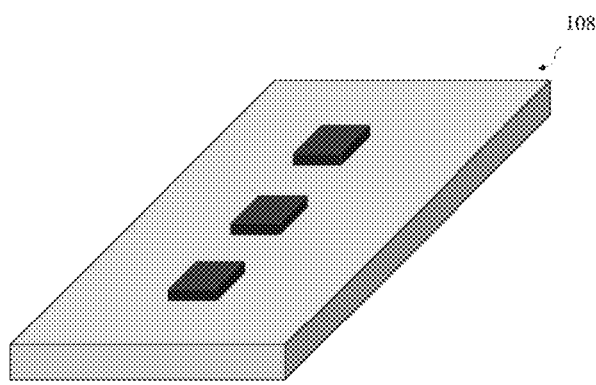
Figure 1J:
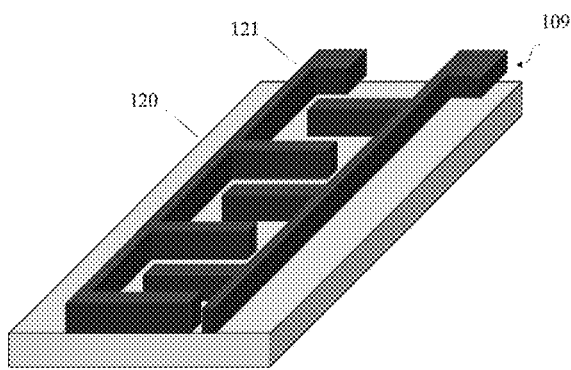

In the following description there are details concerning the materials and process steps to provide better understanding of this disclosure.

In accordance with some implementations of the present disclosure, vertically aligned multiwall (VCNTs) carbon nanotubes may be synthesized using a chemical vapor deposition (CVD) method in a horizontal furnace using acetylene as the carbon precursor at temperature of 780° C. for 5 minutes. The height of CNT forest may vary from 250 to 380 µm. The detailed description of growing a CNT forest on a catalyst-incorporated substrate and tuning the spinability of the carbon nanotubes is available in commonly owned U.S. Pat. No. 8,409,768, the contents of which are incorporated herein by reference in their entirety as if fully set forth herein.

The process of growing the spin-capable CNT forest may include putting the catalyst-incorporated substrate on a heater block in a chemical vapor deposition (CVD) chamber (e.g., horizontal furnace). The step of growing the CNT forest may further include heating the CVD chamber up to a temperature for the growth of CNT forest. The process of growing the CNT forest may further include holding the substrate in the CVD chamber at the temperature for the growth of CNT forest. The process of growing the CNT forest may further include providing a gas mixture comprising CNT-forming precursors and carrier gases. The process of growing the CNT forest may further include growing the CNT forest on the substrate such that the CNT forest is substantially aligned in a direction perpendicular to the substrate.

The hold temperature of the heater block in the CVD chamber nay be between room temperature and the temperature for the growth of CNT forest. The temperature for the growth of the CNT forest may be between about 650° C. and about 850° C. The heating rate up to the temperature for the growth of CNT forest may be between about 10° C./minute and about 1000° C./minute. The substrate that is heated up to the temperature for the growth of CNT forest may stay less than 30 minutes in carrier gases. Before growing the CNT forest, carrier gases may be supplied into the CVD chamber. The CNT-forming precursor may include acetylene. The carrier gases may include nitrogen and an inert gas. The inert gas may be helium, nitrogen, or argon. The flow rate of the acetylene may be between about 200 sccm and about 1000 sccm. The flow rate of the hydrogen may be between about 50 sccm and about 1000 sccm. The flow rate of the inert gas may be between about 1 slm and 30 slm.

In some implementations, an Fe catalyst film having a sheet resistance in the range of about 10 kΩ/square [~3 nm] to about 1 MΩ/square [~9 nm] is deposited on a thermal-oxidized silicon substrate, and the conductivity, sheet resistance, resistivity of said film is measured. Then the catalyst-incorporated substrate is put on a heater block in a chemical vapor deposition (CVD) chamber, the heater block (which may be used for a vertical furnace, for a horizontal the heater block may not be used, or a CVD furnace may be used) using a CVD process is heated up to a temperature (780° C.) for the growth of CNT forest under a gas mixture of hydrogen (100 sccm) and helium (20 slm) as a carrier, and the substrate is held in the CVD chamber at the temperature for the growth of CNT forest during 0~30 minutes under the carrier gases. A gas mixture comprising acetylene (700 sccm) as a CNT-forming precursor and the carrier gases is supplied during 1~30 minutes for the growth of the spin-capable CNT forest on the substrate such that the CNT forest are very well aligned in a direction perpendicular to said substrate. A bundle of CNTs is pulled out from the CNT forest, forming CNT sheets or yarns comprised of the CNT bundles which are entangled end to end, in which the CNTs are mostly oriented parallel to each other along the drawing direction.

FIGS. 1A-1F illustrate a patterning (etching) process for carbon nanotube (CNT) in accordance with some implementations of the present disclosure. As may be seen in FIGS. 1A-1F, multiple sheets of carbon nanotube (CNT) 120 may be stacked (100) on a substrate (121) (e.g., silicon, glass substrate. a flexible polymer, a silicon wafer, Polydimethylsiloxane (PDMS), a PA sheet) and polyimide (PI) (OHP, PET, or PI may be used, or other polymeric substrates). CNT sheets 120 may have different length and width. In some implementations, the CNT sheets 120 may have same dimensions. The CNT sheets 120 may be drawn from the carbon nanotube forest that is grown as described above. Any number of CNT sheets (layers) may be chosen to put onto the substrate. For example, samples of one, five, ten, twenty, thirty, and fifty layers of CNT sheets may be prepared (e.g., drawn from the CNT forest) for stacking on the substrate.

After the CNT sheets 120 are stacked on the substrate 121, the CNT sheets 120 may be etched by selective exposure of the CNT sheets 120 to plasma via a shadow mask 122. As may be seen in FIG. 1B, the shadow mask 122 may be employed (101) (e.g., stacked or laid over) over the CNT sheets 120 stacked on the substrate 121. In some implementations, the CNT sheets 120 may be exposed (102, 103, 104) via the shadow mask 122 to the oxygen plasma in a capacitively coupled plasma (CCP) system. Different plasma power, gas pressure, gas flow, temperature, and processing time may be examined (controlled) in the CCP system to tune the process. Plasma etching condition vary from substrate to substrate and is different for various thicknesses of the CNT sheets. After plasma exposure, the parts on which CNT sheets 120 are protected by the shadow mask 122 are preserved, and the unwanted regions are removed. The etched CNT sheets are depicted as 105 in FIG. 1F. Critical dimensions may be obtained when there is minimum gap between the physical mask (e.g., shadow mask) and the CNT sheet samples.

In some implementations, for the CCP system, different gas pressure from 100 to 250 mTorr with different oxygen gas flow of 15-25 mTorr may be tested to find the optimum pressure for etching. Similarly, plasma power with two different power values of 100 W and 200 W may be used to find the effect and non-destructive atmosphere for CNT etching in the CCP system. Similarly, different processing times from 50 s to 1200 s may be studied to be find the optimum processing time for etching. The processing time may vary depending on a number of layers (e.g., 5, 10, 20, 30, and 50) of CNT arrays, substrate and may also vary based on electrode interspacing.

In an example, the processing times of 200 to 350 s, for CNT multisheets of 10 layers with electrode interspacing of 40 μm were used by the inventors of the present disclosure. Similarly, in another example, processing times of 950 to 1200 s, for CNT multisheets of 10 layers with electrode interspacing of 15 μm were used for etching. Further, different configurations of ground and power plates may be used to find the most effective configuration for plasma.

In some implementations, before stacking the CNT sheets 120, substrate 121 may be cleaned with the regular cleaning process using acetone, isopropyl alcohol (IPA), and deionized (DI) water. For example, 5 min etch, and Piranha cleaning may be carried out to clean the surface of the substrate 121 from any organic chemicals. To increase the adhesion of CNT sheets 120 with the substrate 121, and to sustain the alignment of the structure, after stacking the layers 120, a small drop of ethanol (or acetone) may be used onto the prepared CNT sheet samples, which may help densifying the nanotubes and with their adhesion to substrate.

FIGS. 1G-1J illustrate schematic examples of patterned carbon nanotube sheets that have been patterned with the etching process illustrated in FIGS. 1A-1F. As may be seen in FIGS. 1G-1J, carbon nanotube sheets 120 patterned with different shapes, features and sizes (106, 107, 108, and 109), may be realized with the patterning techniques disclosed herein. For example, patterned CNT sheets 120 with circular structures, square shaped structures, and interdigitate (IDE) structures etc. may be realized with the plasma etching process disclosed herein.

Figure 2A:
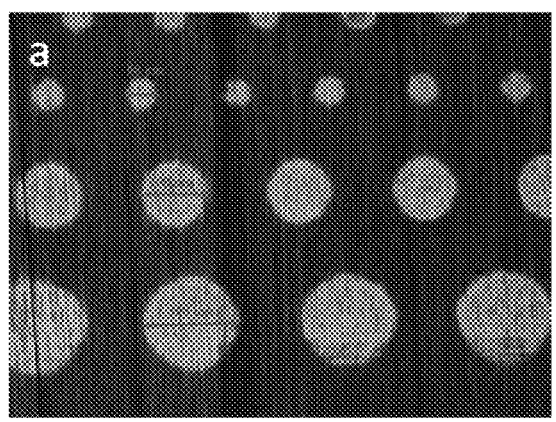
FIGS. 2A and 2B depict optical images of circular and square patterns with various dimensions using a metallic shadow mask on 10 layers of CNT sheet.
Figure 2B:
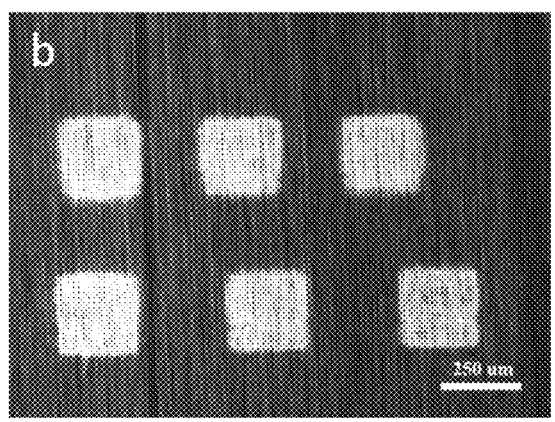

FIGS. 2A and 2B represent optical images of 10 layers of CNT sheets stacked on a silicon substrate with circular and square shaped pattern. In an illustrative example, a p-type silicon wafer with an area of 1 cm×1 cm size with 100 nm inherent silicon oxide layer was used as a substrate to grow CNT forest, and the silicon oxide layer was previously covered by a layer of $Al_2O_3$ with 3 nm thickness, and a layer of iron with 3 nm thickness. Iron layer was used as the catalyst to grow the nanotubes. A piece of silicon wafer with as-grown CNT forest array was used to make the sheets. VCNT forest was fixed on a sample holder that rotates with the same speed as the motor. A piece of silicon wafer with the area of 3 cm×1 cm was chosen as the substrate to stack the CNT sheets. The substrate could also be made of glass, metal, silicon wafer or any flexible substrate. Drawing and stacking the CNT sheets was done using a setup designed in the lab spooling system. Carbon nanotube sheet was drawn from the forest using a fine-tip tweezer and then it was directly stacked on a Si substrate (1 cm×3 cm). Sample holder (CNT forest holder) was connected to the spooling system via the CNT sheet and small stepper motor carried out the final transfer of drawn sheet onto the substrate. To achieve a uniform density of the stacked CNT on substrate, CNT sheets were stacked onto the Si substrate with the rotation speed of 5 rpm. Uniformity is also affected by the quality of the VCNT sample which is defined by highly dense iron nanoparticles structure in the growth time. So, uniformity of the deposited iron catalyst layer greatly affects the spin capability properties of the VCNT forest array.

Multi-sheets of CNT with different width and length were laid on silicon and glass substrates. Samples of one, five, ten, twenty, thirty and fifty layers of carbon sheets were prepared. Any number of layers may be chosen to put onto the substrate. Different plasma power, gas pressure and processing time were examined in a CCP plasma system to tune the process. Plasma etching condition vary from substrate to substrate and is different for various thickness of the CNT sheets. After plasma exposure, the parts on which CNT sheets were protected by the shadow mask were preserved, and the unwanted regions were removed. Critical dimension was obtained only when there was a minimum gap between the physical mask and the CNT samples.

Figure 3A:
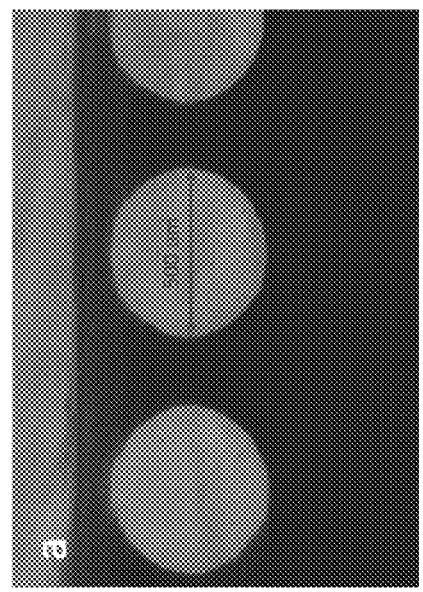
FIG. 3A depicts an optical image of circular patterns with the diameter of 500 μm using metallic shadow masks with different thicknesses on 10 layers of CNT sheet.
Figure 3B:
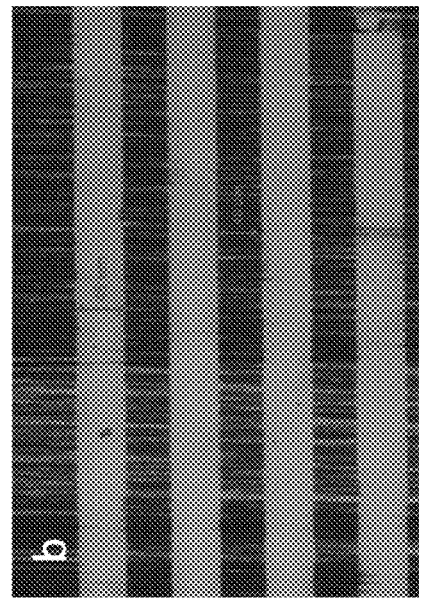
FIG. 3B depicts an interdigitated electrodes (IDE) pattern of multi-sheets of S-layer with gap size of 40 and 45 μm using a designed Si shadow mask.
Figure 10A:
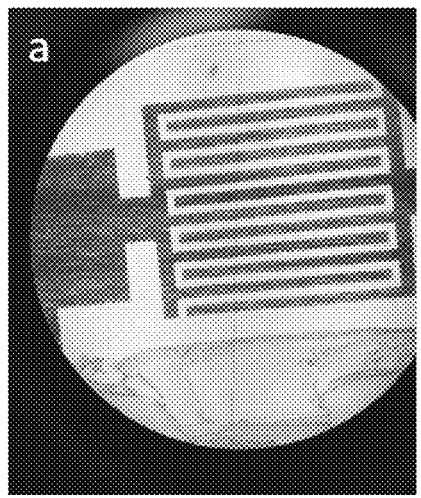
FIGS. 10A and 10B illustrate optical images of an IDE pattern on CNT multi-sheets, of 5 layers with 145 µm gap size and 300 µm electrode width, patterned using a designed Si shadow mask on a glass slide substrate.
Figure 10B:
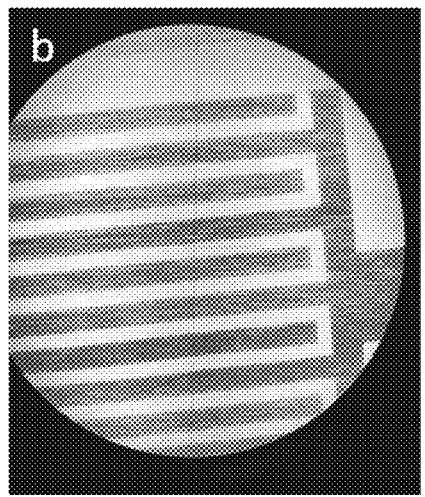
Figure 10C:
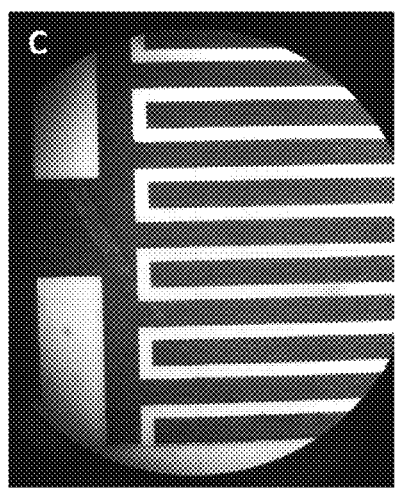
FIG. 10C depicts a micro-pattern on a 10-layer array.
Figure 10D:
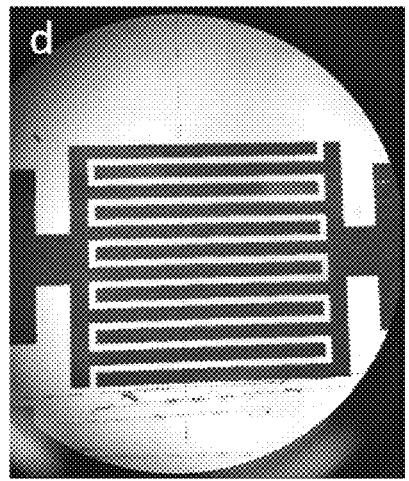
FIG. 10D depicts a micro-pattern on a 20-layer array.
Figure 10E:
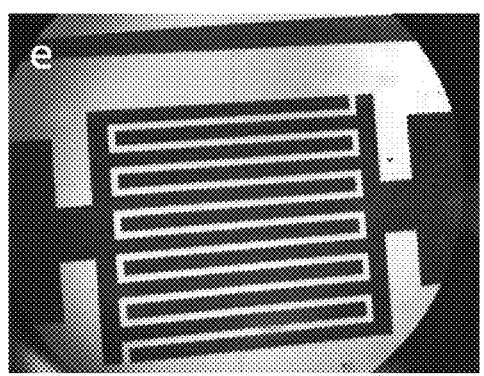
FIG. 10E depicts a micro-pattern on a 30-layer array.
Figure 10F:
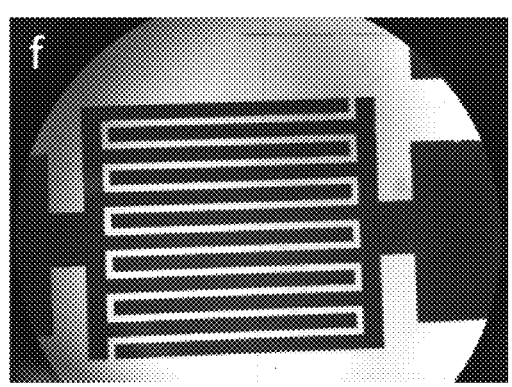
FIGS. 10F-10J depict a micro-pattern on a 50-layer array.
Figure 10H:
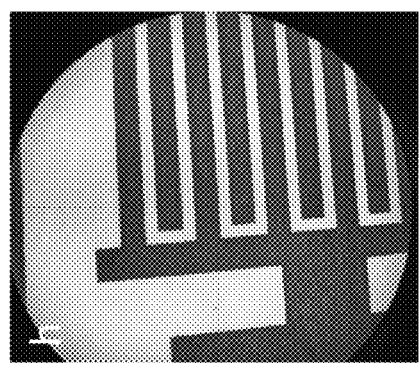
Figure 10G:
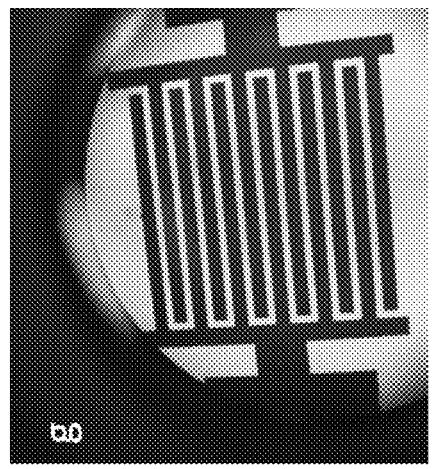
Figure 10I:
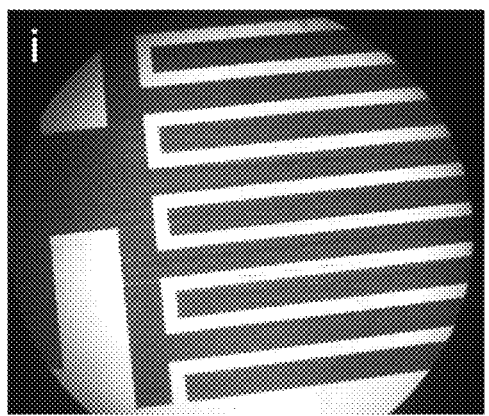
Figure 10J:
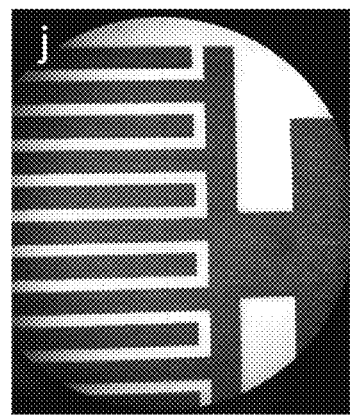

Before stacking the CNT, the silicon substrate may be cleaned with the regular cleaning process using acetone, IPA and DI water, 5 min etch, and/or Piranha cleaning to clean the surface from any organic chemicals. To increase the adhesion of CNT with the substrate and to sustain the alignment of the structure, after stacking the layers, a small drop of ethanol was used onto the prepared CNT sheet samples that also helped the densifying the nanotubes. Using a metallic shadow mask, circular and square shape patterns were etched on 10 layers of CNT sheets on a silicon wafer (FIGS. 2A, 2B, 3A, 3B). An optical image 302 of circular patterns with the diameter of 500 μm patterned using metallic shadow masks with different thicknesses on 10 layers of CNT sheet is depicted in FIG. 3A. An optical image 304 of an interdigitated electrodes (IDE) pattern on CNT multisheets of S-layer with gap size of 40 and 45 μm using a designed Si shadow mask is depicted in FIG. 3B.

Plasma etching conditions that were employed include pressure of the oxygen gas 200 and 250 mTorr, power of the plasma 100 W, and oxygen gas flow was 15 and 20 sccm, and the processing time was kept around 400 s. By increasing the flow of oxygen gas to 25 sccm and decreasing the etching time to 300 s, circular patterns were formed on the CNT sheet with sharp edges and diameter of 500 μm (FIG. 2A). Here again a metallic shadow mask was used for etching. The etching process for 50 s was also tried which turned out to be insufficient for full etching.

FIGS. 4A and 4B depict optical images 402, 404 of multi-sheets of 10-layer using a metallic shadow mask, and optical images 502, 504 of patterned CNT multi-sheets of 10-layer, with interspacing of 15 μm, patterned using a designed Si shadow mask are depicted in FIGS. 5A and 5B. Optical images 602, 604 depict optical images of an IDE pattern on multi-sheets of 10 CNT layers, with different resolution (100-160 μm), patterned using a designed Si shadow mask on a Si substrate are depicted in FIGS. 6A and 6B. An optical image 702 of an IDE pattern on multi-sheets of 10 CNT layers, with a gap size of 145 μm and electrode width of 300 μm, for electrodes, patterned using a designed Si shadow mask on gold coated silicon substrate is depicted in FIG. 7A. The magnified view of optical image 702 is depicted as optical image 704 in FIG. 7B. Similarly, optical images 1202, 1204 of an IDE pattern of multi-sheets of 10 CNT layers on gold coated silicon wafer, with resolution of 40 μm, patterned using a designed Si shadow mask are depicted in FIGS. 12A and 12B. Optical images 1206, 1208 of an IDE pattern of multi-sheets of 10 CNT layers on gold coated silicon wafer, with resolution of 15 μm, patterned using a designed Si shadow mask are depicted in FIGS. 12C and 12D.

Using metallic shadow masks, simple structures were patterned on the CNT sheets. However, for more complicated structures with smaller feature sizes, metallic masks fell short as masks below certain dimensions were not available. To do so, several shadow masks based on silicon wafer were designed and fabricated using DRIE-deep reactive ion etching (deep silicon etching) process. The shadow masks may be designed based one or more structures (e.g., circular, square, IDE pattern) to be patterned on the CNT sheets. IDE pattern structures with various interspacing (from 15 to 200 μm) were fabricated and were used to pattern horizontally aligned array of CNTs. Different plasma etching conditioning were used. Etching and preserving an IDE pattern on multi-sheets of 1, 5, 10, 20, 30, and 50 layers was attempted (FIGS. 10A-10J). Tuning the plasma etching condition, the resolution (electrode interspacing) up to 15μ was improved (with total pressure of 200 mTorr, power 100 W, O2 gas flow of 17 sccm, etching time of 950-1100 seconds, which may be substrate-dependent).

IDE structures with wider gap size of 145 μm and electrode width of 160 μm on multi-sheets of 10 (image 802 of FIG. 8A) and 5 CNT layers (image 804 of FIG. 8B) using a Si shadow mask on glass substrate were obtained.

In another example, one layer of CNT sheet may be patterned on an acrylic substrate showing the potential of this technique to etch a thin layer of CNT sheets (image 902 of FIG. 9).

In FIGS. 10A-10J, CNT multi-sheets of different layers (from 5 to 50 layers) demonstrate an IDE patterns (images 1002, 1004, 1006, 1008, 1010, 1012, 1014, 1016, 1018, 1020) suggesting the capability of plasma patterning for different thickness of CNT layers while maintaining the accuracy and resolution. A transparent micro glass slide is used as substrate, and Si wafer is used as the shadow mask. High feature resolutions and sharp pattern edges demonstrate this method is promising to fabricate a CNT-based micro supercapacitor with different CNT layers.

As mentioned before, another Si shadow mask was designed and fabricated to preserve the IDE structure on the substrate and to etch the surrounding CNT sheets to see if this method may be used to fabricate micro-supercapacitor with high-dimensional precision. Plasma etching process occurred in a CCP system for 10 layers of CNT sheet with a gas pressure of 100 mTorr, power of 100 W, 15 sccm of oxygen gas flow, and 100-160 s for 10 L etching time. For different processes, condition was tuned to effectively etch the layers without having any issue.

Figure 11A:
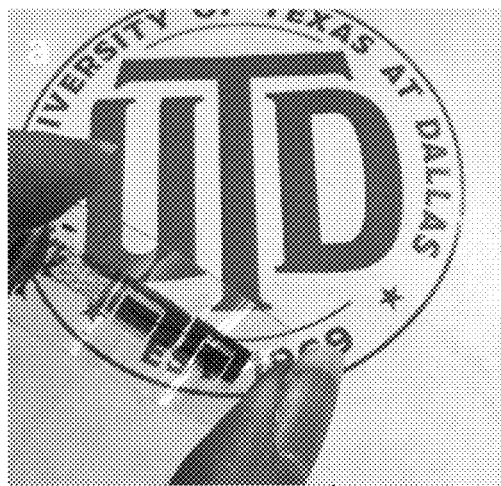
Figure 11B:
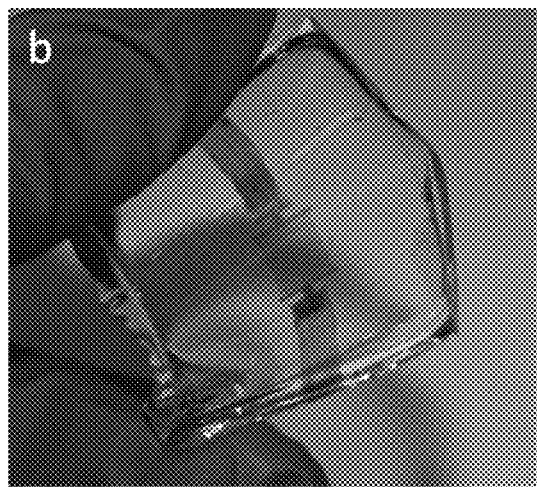

In another approach, a flexible substrate was used, and 10 CNT sheets were stacked on it. FIG. 11A demonstrates that IDE and circular patterns on flexible substrates such as OHP film (image 1102 of FIG. 11A), and FIG. 11B clearly demonstrates that IDE and circular patterns on flexible substrates PDMS (image 1104 of FIG. 11B) using this method are possible, and this reveals the potential of the disclosed method to fabricate flexible micro-devices. FIG. 11C (image 1106) shows how bending is possible using CNT ribbons, and FIG. 11D (image 1108) shows the microstructure in the higher magnification.

Using this approach, the inventors were able to go down to 40 μm resolution and 15 μm gap size while sustaining the accuracy. The limit to dimension is exposed to some extent by the shadow mask fabrication process.

Figure 13A:
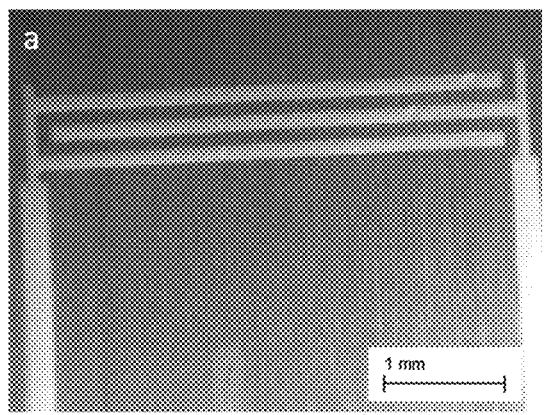
FIGS. 13A and 13B depict scanning electron microscope (SEM) images of the IDE patterns with different resolutions on opposite directions (a) and (b) the same direction as CNT arrays.
Figure 13B:
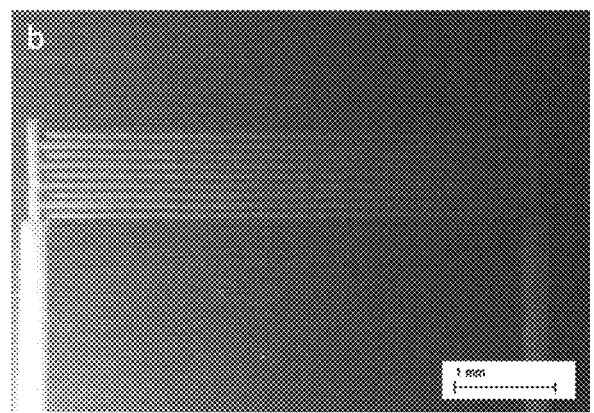
Figure 14A:
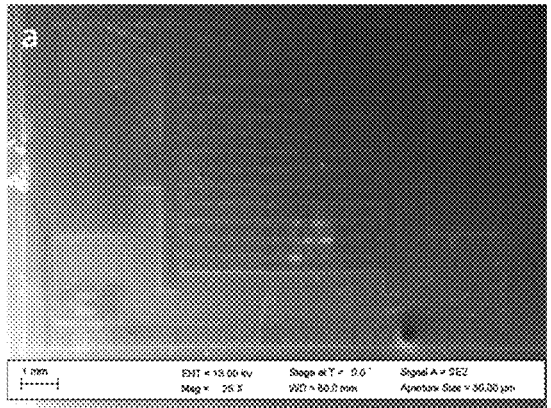
FIGS. 14A and 14B depict SEM images of the IDE patterns on CNTs with 145 µm gap size on a gold coated Si substrate.
Figure 14B:
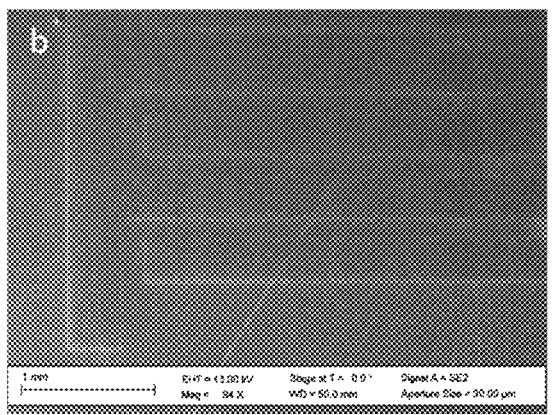

Scanning Electron Microscope (SEM) images 1302, 1304 of the etched IDE are shown in FIGS. 13A and 13B with various feature sizes, and a micro-supercapacitor with IDE structure with 145 μm gap size in both the same and opposite direction of the fibers. In both cases, a stack of 10 layers CNT sheet on a Si substrate was used. SEM images 1402, 1404 of the IDE pattern with 145 μm gap size on a gold coated Si substrate are depicted in FIGS. 14A and 14B.

The techniques of the present disclosure provides a controllable, facile and reproducible way of patterning carbon nanotube sheets (ribbons) with large-scale production potential. Later, CNT ribbons may be integrated into variety of substrates to provide the desired properties for a wide range of applications such as micro-scale energy harvesters, lithium batteries, CNT membrane, micro-supercapacitor, biosensors, flexible electronics, wearable power micro-devices, composite liquid crystal elastomer actuator (LCEs), flexible transparent conducting films (TCFs) etc.

The methods disclosed herein include employing a shadow mask to etch CNT sheet(s) selectively with desired features (e.g., size and shape). In some implementations, the shadow mask in a CCP system is employed to etch CNT sheets with desired pattern(s). The shadow mask may have been used for metal deposition in the past, but it has not been used to etch carbon nanotube, at least without using a binder or photoresist so far.

The present disclosure addresses the necessity for controllably patterning highly aligned carbon nanotube sheet with small complexity and high uniformity. The techniques disclosed in the present disclosure avoids the difficulty of using conventional photolithography approach and immersion of CNT in liquid solution that adversely affects electrical and mechanical properties. The techniques disclosed in the present disclosure are reproducible and may be accomplished on industrial scale. Two critical perquisites for micro patterning using plasma as disclosed herein are substantial control over homogenous dispersion and alignment of nanotubes in its dry medium.

The techniques disclosed herein are specifically powerful for micro-scale devices which are too small to be reliably patterned. Another advantage of micro patterning with plasma is the ease of patterning with minimum self-aggregation of nanotubes, and without demanding for multiple preparation and post-treatments steps.

The primary advantage of the techniques disclosed herein over other approaches (e.g., where photolithography and other complicated post treatments are involved) is that there is no need for pre and post treatment steps, and only by selectively exposing one or more regions of the CNT sheets to the plasma, a precise pattern may be achieved. For example, an interdigitated structure with high dimensional accuracy of 15 μm interspacing may be built by the methods disclosed herein. Also this technique may be 100% binder free.

The examples provided herein are to more fully illustrate some of the embodiments of the present disclosure. It should be appreciated by those of skill in the art that the techniques disclosed in the examples which follow represent techniques discovered by the inventors to function well in the practice of the disclosure, and thus may be considered to constitute exemplary modes for its practice. However, those of skill in the art should, in light of the present disclosure, appreciate that many changes may be made in the specific embodiments that are disclosed and still obtain a like or similar result without departing from the spirit and scope of the invention.

All patents and publications referenced herein are hereby incorporated by reference. It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications may be practiced in conjunction with the present invention, but they are not essential to its practice. It is therefore to be understood that the invention may be practiced otherwise than as specifically described without actually departing from the spirit and scope of the present invention.

What is claimed is:

1. A method to pattern carbon nanotubes, the method comprising:
   growing a spin-capable carbon nanotube forest on a catalyst-incorporated substrate;
   drawing one or more carbon nanotube sheets from the carbon nanotube forest;
   stacking the one or more carbon nanotube sheets on another substrate; and
   etching the one or more carbon nanotube sheets by selectively exposing the one or more carbon nanotube sheets to an oxygen plasma via a shadow mask, wherein the shadow mask comprises a metal.

2. The method of claim 1, wherein growing the carbon nanotube forest includes growth of carbon nanotube forest in a chemical vapor deposition (CVD) furnace using acetylene as a carbon nanotube-forming precursor.

3. The method of claim 2, wherein growing the carbon nanotube forest in the CVD furnace includes providing a gas mixture comprising one or more carbon nanotube-forming precursors and one or more carrier gases, and wherein the one or more carrier gases are selected from the group consisting of Helium, Nitrogen, and Argon.

4. The method of claim 2, further comprising controlling temperature inside the CVD furnace to be between 650° C. to 850° C. for growth of the carbon nanotube forest.

5. The method of claim 1, further comprising depositing a catalyst film on a substrate to form the catalyst-incorporated substrate, wherein the catalyst film comprises a transition metal, and wherein a thickness of the catalyst film is less than 20 nanometers.

6. The method of claim 5, wherein the transition metal includes iron.

7. The method of claim 1, wherein stacking the one or more carbon nanotube sheets on the another substrate includes stacking the one or more carbon nanotube sheets without using any of a binder and a photoresist.

8. The method of claim 1, wherein stacking one or more carbon nanotube sheets on a substrate includes stacking one or more carbon nanotube sheets on a substrate comprising one or more of: a flexible polymer OHP, Polyethylene terephthalate (PET), Polyimide (PI), a silicon wafer, a glass slide, Polydimethylsiloxane (PDMS), and a poly acrylic (PA) sheet.

9. The method of claim 1, wherein the shadow mask includes a silicon shadow mask.

10. The method of claim 1, further comprising designing the shadow mask based on one or more structures to be patterned on the one or more carbon nanotube sheets.

11. The method of claim 10, further comprising fabricating the shadow mask from a silicon wafer using deep silicon etching.

12. The method of claim 1, wherein the shadow mask comprises a metallic shadow mask.

13. The method of claim 1, wherein the shadow mask comprises a nickel-copper alloy.

14. The method of claim 1, wherein selectively exposing the one or more carbon nanotube sheets to the plasma via the shadow mask includes exposing the one or more carbon nanotube sheets to oxygen plasma in a capacitively coupled plasma (CCP) etching system.

15. The method of claim 14, further comprising controlling one or more of: gas pressure, gas flow, plasma power, processing time, and temperature of the CCP etching system to optimize etching of the one or more carbon nanotube sheets.

16. A method to pattern carbon nanotubes, the method comprising:
    stacking one or more carbon nanotube sheets on a substrate;
    designing a shadow mask based on one or more structures to be patterned on the one or more carbon nanotube sheets, wherein the shadow mask comprises a metal; and
    employing the shadow mask in a capacitively coupled plasma (CCP) etching system to etch the one or more carbon nanotube sheets,
    wherein employing includes selectively exposing the one or more carbon nanotube sheets to oxygen plasma via the shadow mask, thereby etching the one or more structures on the one or more carbon nanotube sheets.

17. The method of claim 16, wherein employing the shadow mask includes employing a metallic shadow mask.

18. The method of claim 16, wherein designing the shadow mask includes using a deep reactive-ion etching (DRIE) process.

19. The method of claim 16, wherein selectively exposing the one or more carbon nanotube sheets to the oxygen plasma includes exposing one or more regions of the one or more carbon nanotube sheets to the oxygen plasma.

20. The method of claim 16, wherein the substrate includes a transparent micro glass slide, and the shadow mask includes a silicon wafer.

* * * * *